United States Patent
Su et al.

(10) Patent No.: US 10,027,280 B1
(45) Date of Patent: Jul. 17, 2018

(54) INDUCTOR-LESS LOCAL OSCILLATOR GENERATION APPARATUS

(71) Applicant: Novatek Microelectronics Corp., Hsinchu (TW)

(72) Inventors: Cheng-Dao Su, Hsinchu County (TW); Chih-Hung Chen, Kaohsiung (TW); Tzu-Cheng Yang, Hsinchu (TW); Yi-Ming Wu, Kaohsiung (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 15/653,519

(22) Filed: Jul. 18, 2017

(51) Int. Cl.
| | |
|---|---|
| *H03K 5/14* | (2014.01) |
| *H03B 5/12* | (2006.01) |
| *H03K 23/40* | (2006.01) |
| *H03K 21/10* | (2006.01) |
| *H04B 17/10* | (2015.01) |

(52) U.S. Cl.
CPC ......... *H03B 5/1228* (2013.01); *H03B 5/1215* (2013.01); *H03K 21/10* (2013.01); *H03K 23/40* (2013.01); *H04B 17/10* (2015.01)

(58) Field of Classification Search
CPC .... H03B 5/1228; H03B 5/1215; H03K 23/40; H03K 21/10; H04B 17/10
See application file for complete search history.

(56) References Cited

U.S. PATENT DOCUMENTS

| 5,901,190 A | * | 5/1999 | Lee | H03L 7/0814 |
| | | | | 327/158 |
| 7,031,668 B2 | | 4/2006 | Darabi et al. | |
| 8,723,568 B1 | | 5/2014 | Terrovitis | |
| 2006/0165205 A1 | * | 7/2006 | Daily | H03M 9/00 |
| | | | | 375/371 |
| 2014/0055181 A1 | * | 2/2014 | Chaivipas | H03K 5/26 |
| | | | | 327/156 |

OTHER PUBLICATIONS

Yu-Li Hsueh et al.,"A 0.29mm2 Frequency Synthesizer in 40nm CMOS with 0.19psrms Jitter and <-100dBc Reference Spur for 802.11ac",2014 IEEE International Solid-State Circuits Conference Digest of Technical Papers (ISSCC) , Feb. 9-13, 2014,pp. 472-474.

* cited by examiner

*Primary Examiner* — Dac Ha
(74) *Attorney, Agent, or Firm* — JCIPRNET

(57) ABSTRACT

An inductor-less local oscillator (LO) signal generation apparatus configured to generate one or more output signals which reduce a frequency pulling effect. The LO signal generation apparatus includes a multi-phase signal generation circuit, a phase signal generation circuit and one or more output circuits. The multi-phase signal generation circuit receives an input clock signal having a first frequency to generate a multi-phase clock signal. The multi-phase clock signal includes a plurality of clock signals each having the first frequency and different phases. The phase signal generation circuit is coupled to the multi-phase signal generation circuit to receive the multi-phase clock signal and output a plurality of phase signals indicating the phases of the clock signals. The one or more output circuits output the one or more output signals according to the clock signals and the phase signals without receiving feedback of any of the one or more output signals.

14 Claims, 5 Drawing Sheets

INDUCTOR-LESS LOCAL OSCILLATOR GENERATION APPARATUS

BACKGROUND OF THE INVENTION

1. Field of the Invention

The disclosure generally relates a signal generation apparatus, and specifically to an inductor-less local oscillator (LO) signal generation apparatus for generating one or more output signals that is capable of reducing a frequency pulling effect of a radio-frequency transceiver.

2. Description of Related Art

In wireless communication field, a frequency synthesizer can produce a variety of output frequencies or a range of frequencies. The frequency synthesizer is usually used to provide a range of frequencies such as a reference frequency to a radio-frequency transceiver. However, because of frequency synthesizer's characteristics (having LC oscillators), the frequency synthesizer is subject to the external interferences which cause the frequency pulling effect to contaminate the spectral purity and negatively impact the quality of signals transmitted or received by the radio-frequency transceiver. For example, when an output frequency of the radio-frequency transceiver is the same as the frequency of the frequency synthesizer, the radio-frequency transceiver may be prone to the frequency pulling effect. As a result of the frequency pulling effect, the frequency synthesizer may fail to generate the variety of output frequencies or a range of frequencies. To mitigate the frequency pulling effect, a local oscillator (LO) generation apparatus are provided so as to assure that the output frequency of the radio-frequency transceiver is different from the frequency of the frequency synthesizer.

In the related art, inductors are usually included in the LO generation apparatus. However, due to the high production cost, numerous applications are not being fully commercialized because of the LO generation apparatus having inductors. Further, a feedback-loop is often used in designing LO generation apparatus so as to adjust operations of the LO generation apparatus based on a feedback signal. However, since the output frequency of the LO generation apparatus is depended on input clock mismatch, the feedback-loop may affect negatively to the output frequency of the LO generation apparatus. For example, when the input phase mismatch is too large, the output frequency signal of the LO generation apparatus is incorrect, thereby reduce the stability and reliability of the LO generation apparatus. The addition of the feedback-loop may further increase the production cost of the LO generation apparatus, thus limiting the commercialized applications of the LO generation apparatus.

Thus, it would be desirable to have a LO generation apparatus which eliminates the appearance of inductors and feedback-loop while producing the output signals which can solve the frequency pulling effect.

Nothing herein should be construed as an admission of knowledge in the prior art of any portion of the present disclosure. Furthermore, citation or identification of any document in this application is not an admission that such document is available as prior art to the present disclosure, or that any reference forms a part of the common general knowledge in the art.

SUMMARY OF THE INVENTION

An inductor-less local oscillator (LO) signal generation apparatus for generating one or more output signals (local oscillator signals) from an input clock signal is introduced herein.

The inductor-less LO signal generation apparatus includes a multi-phase signal generation circuit, a phase signal generation circuit and one or more output circuits. The multi-phase signal generation circuit receives an input clock signal having a first frequency to generate a multi-phase clock signal. The multi-phase clock signal includes a plurality of clock signals, each having the first frequency and different phases. The phase signal generation circuit is coupled to the multi-phase signal generation circuit to receive the multi-phase clock signal and output a plurality of phase signals indicating the phases of the clock signals. Each of the one or more output circuits is configured to output one of one or more output signals according to the clock signals and the phase signals without receiving feedback of any of the one or more output signals. Each of the one or more output circuits comprises: a plurality of respective input terminals, a respective output terminal and a plurality of respective switches. The plurality of respective input terminals is configured to receive the clock signals. The respective output terminal is configured to output one of one or more output signals. Each of the plurality of respective switches is coupled between one of the respective input terminals and the respective output terminal and is controlled by one of the phase signals.

In an exemplary embodiment, each of the one or more output signals has a frequency substantially equal to a second frequency which is lower than the first frequency.

In an exemplary embodiment, the multi-phase signal generation circuit includes a plurality of delay elements connected in series. Each of the delay elements has an output terminal to output one of the clock signals of the multi-phase clock signal. The number of the delay elements are determined according to the first frequency and the second frequency.

In an exemplary embodiment, the phase signal generation circuit includes a plurality of latches. Each of the latches receives one of the clock signals of the multi-phase clock signal and outputs one of the phase signals. Each of the phase signals has a frequency lower than the first frequency, and the phase signals have different phases.

In an exemplary embodiment, each of the one or more output circuits receives the plurality of the phase signals and the plurality of the clock signals. The plurality of respective switches of each of the one or more output circuits is controlled by the phase signals to output the one or more output signals. The one ore more output signals include at least one of an in-phase clock signal and a quadrature phase clock signal.

In another exemplary embodiment, the inductor-less LO signal generation apparatus further includes a frequency pulse sharper and a frequency divider. The frequency pulse sharper is coupled to the plurality of latches to receive the plurality of phase signals to generate a signal having a third frequency. The third frequency is higher than the first frequency. The frequency divider receives the signal from the frequency pulse sharper and divides the third frequency of the signal from the frequency pulse sharper to generate the one or more output signals having a frequency substantially equal to the second frequency. The second frequency is smaller than the third frequency.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

It is to be understood that other embodiments may be utilized and structural changes may be made without departing from the scope of the present disclosure. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted," and variations thereof herein are used broadly and encompass direct and indirect connections, couplings, and mountings.

Figure 1:
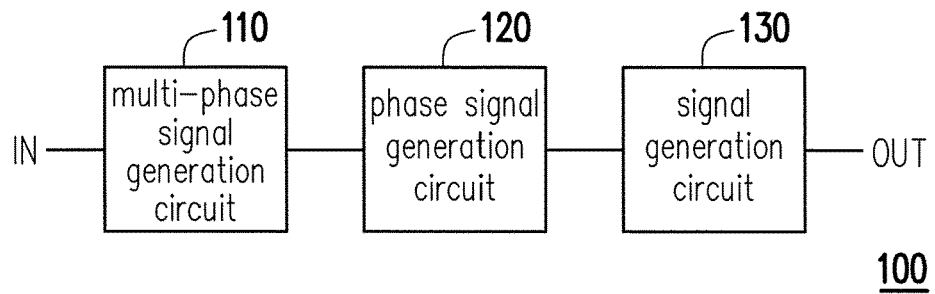
FIG. 1 is a schematic diagram illustrating an inductor-less LO signal generation apparatus according to an exemplary embodiment of the disclosure.

FIG. 1 is a schematic diagram illustrating an inductor-less LO signal generation apparatus 100 according to an exemplary embodiment of the disclosure. Referring to FIG. 1, the inductor-less LO signal generation apparatus receives an input clock signal IN having a first frequency and outputs one or more output signals OUT having a frequency that is substantially equal to a second frequency, where the second frequency is lower than the first frequency. In an exemplary embodiment of the disclosure, the first frequency is 3.2 GHz and the second frequency is 2.4 GHz. However, the disclosure is not limited thereto. The first and second frequencies may be any frequencies as long as the second frequency is lower than the first frequency. The inductor-less LO signal generation apparatus 100 includes a multi-phase signal generation circuit 110, a phase signal generation circuit 120, and a signal generation circuit 130. The multi-phase signal generation circuit 110 receives the input clock signal IN, generates a multi-phase clock signal according to the recited input clock signal IN, and provides the generated multi-phase clock signal to the phase signal generation circuit 120. The phase signal generation circuit 120 can be coupled to the multi-phase signal generation circuit 110 to receive the multi-phase clock signal and generate a plurality of phase signals according to the multi-phase clock signal, wherein the plurality of phase signals indicates the phases of the clock signals. The signal generation circuit 130 can be coupled to the phase signal generation circuit 120 to receive the plurality of phase signals and the multi-phase clock signal from the phase signal generation circuit 120, and it can generate the one or more output signals OUT according to the clock signals and the phase signals. The signal generation circuit 130 can achieve the generation without receiving feedback of any of the one or more output signals.

It is noted that the multi-phase signal generation circuit 110, the phase signal generation circuit 120, and the signal generation circuit 130 are shown as separate circuits but they can be integrated with each other. For example, the signal generation circuit 130 may be directly coupled to the multi-phase signal generation circuit 110 incorporating the phase signal generation circuit 120 such that the signal generation circuit 130 receives the multi-phase clock signal from the multi-phase signal generation circuit 110 in another exemplary embodiment of the disclosure.

Figure 2:
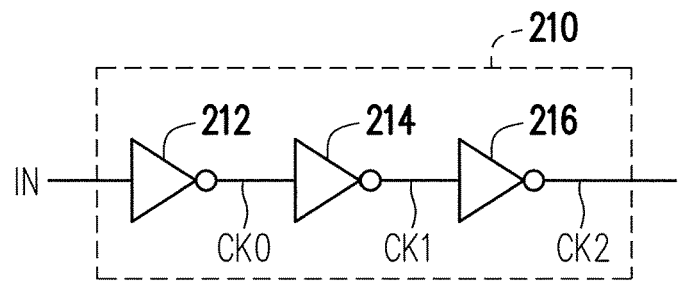
FIG. 2 is a schematic diagram illustrating the multi-phase signal generation circuit in FIG. 1 according to an exemplary embodiment of the disclosure.

FIG. 2 is a schematic diagram illustrating the multi-phase signal generation circuit in FIG. 1 according to an exemplary embodiment of the disclosure. Referring to FIG. 1 and FIG. 2, the multi-phase signal generation circuit 210 includes a plurality of delay elements 212-216 connected in series, each of the delay elements 212-216 having an input terminal for receiving a clock signal and an output terminal for outputting one of the clock signals of the multi-phase clock signal. For example, the multi-phase signal generation circuit 210 includes a first delay element 212, a second delay element 214, and a third delay element 216. The first delay element 212 receives the input clock signal IN and outputting a first clock signal CK0 of the multi-phase clock signal. The second delay element 214 receives the first clock signal CK0 and outputting a second clock signal CK1 of the multi-phase clock signal. The third delay element 216 receives the second clock signal CK1 and outputting a third clock signal CK2 of the multi-phase clock signal. The clock signals CK0, CK1 and CK2 of the multi-phase clock signal have the first frequency (e.g., 3.2 GHz) and are phase-delayed to each other.

The delay elements 212 to 216 may be designed using different technologies and using different materials. For example, the delay element may be designed using semiconductor logic gates, inverters, flip-flops, and buffer circuits, but the disclosure is not limited thereto.

In FIG. 2, the multi-phase signal generation circuit 210 includes three delay elements 212 to 216. However, the present disclosure is not limited thereto. The number of delay elements in the multi-phase signal generation circuit can be set based on the designed requirements. For example, the number of delay elements can be set according to the frequency of the input clock signal and the frequency of the output signals. In addition, it is not required that the number of delay elements to be equal to the number of the clock signals of the multi-phase clock signal.

Figure 6:
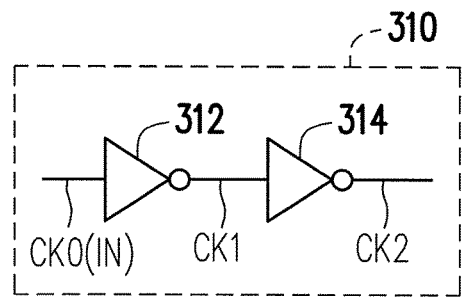
FIG. 6 is a schematic block diagram illustrating the multi-phase signal generation circuit in FIG. 1 according to another exemplary embodiment of the disclosure.

FIG. 6 is a schematic diagram illustrates the multi-phase signal generation circuit in FIG. 1 according to another exemplary embodiment of the disclosure. Referring to FIG. 6, the multi-phase signal generation circuit 310 includes two delay elements 412 and 314, in which the input clock signal IN is directly used as a first clock signal CK0 of the multi-phase clock signal. The first delay element 412 receives the first clock signal CK0 and outputs a second clock signal CK1 of the multi-phase clock signal. The second delay element 414 receives the second clock signal CK1 and outputs a third clock signal CK2 of the multi-phase clock signal.

Figure 3:
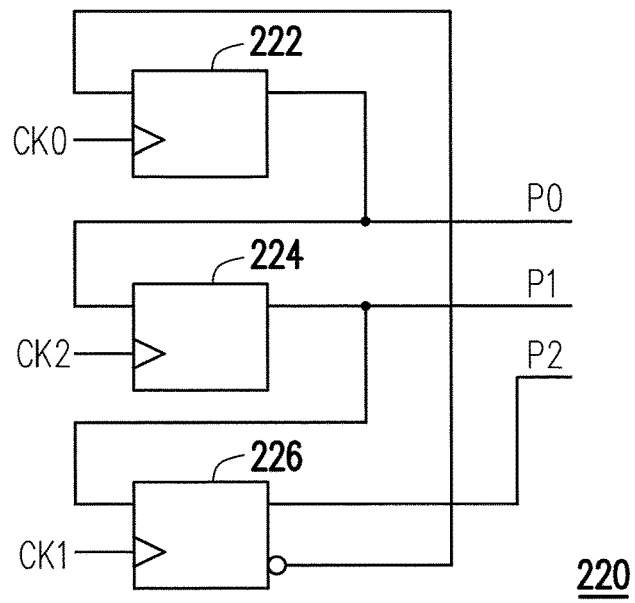
FIG. 3 is a schematic diagram illustrating the phase signal generation circuit in FIG. 1 according to an exemplary embodiment of the disclosure.

FIG. 3 is a schematic diagram illustrating the phase signal generation circuit in FIG. 1 according to an exemplary embodiment of the disclosure. Referring to FIG. 3, the phase signal generation circuit 220 is coupled to the multi-phase signal generation circuit 110 to receive the plurality of clocks signal CK0 to CK2. The phase signal generation circuit 220 includes a plurality of latches 222 to 226, wherein each of latches receives one of the clock signals CK0 to CK2 and a signal outputted by another latch, and outputs one of the phase signals P0-P2. Specifically, the phase signal generation circuit 220 in FIG. 3 includes a first latch 222, a second latch 224 and a third latch 226 which are configured to output a first phase signal P0, a second phase signal P1 and a third phase signal P2 respectively. The first latch 222 receives the first clock signal CK0 and a signal outputted by the third latch 226, and outputs a first phase signal P0. The second latch 224 receives the second clock signal CK1 and the first phase signal P0 outputted by the first latch 222, and outputs the second phase signal P1. The third latch 226 receives the third clock signal CK2 and the second phase signal P1 outputted by the second latch 224, and output the third phase signal P2. In FIG. 3, there are three latches for generating three phase signals. However, the disclosure is not limited thereto. The number of latches, phase signals can be set according to the designed requirements. In an embodiment of the invention, the latches 222 to 224 are D flip-flops (DFF).

Figure 4:
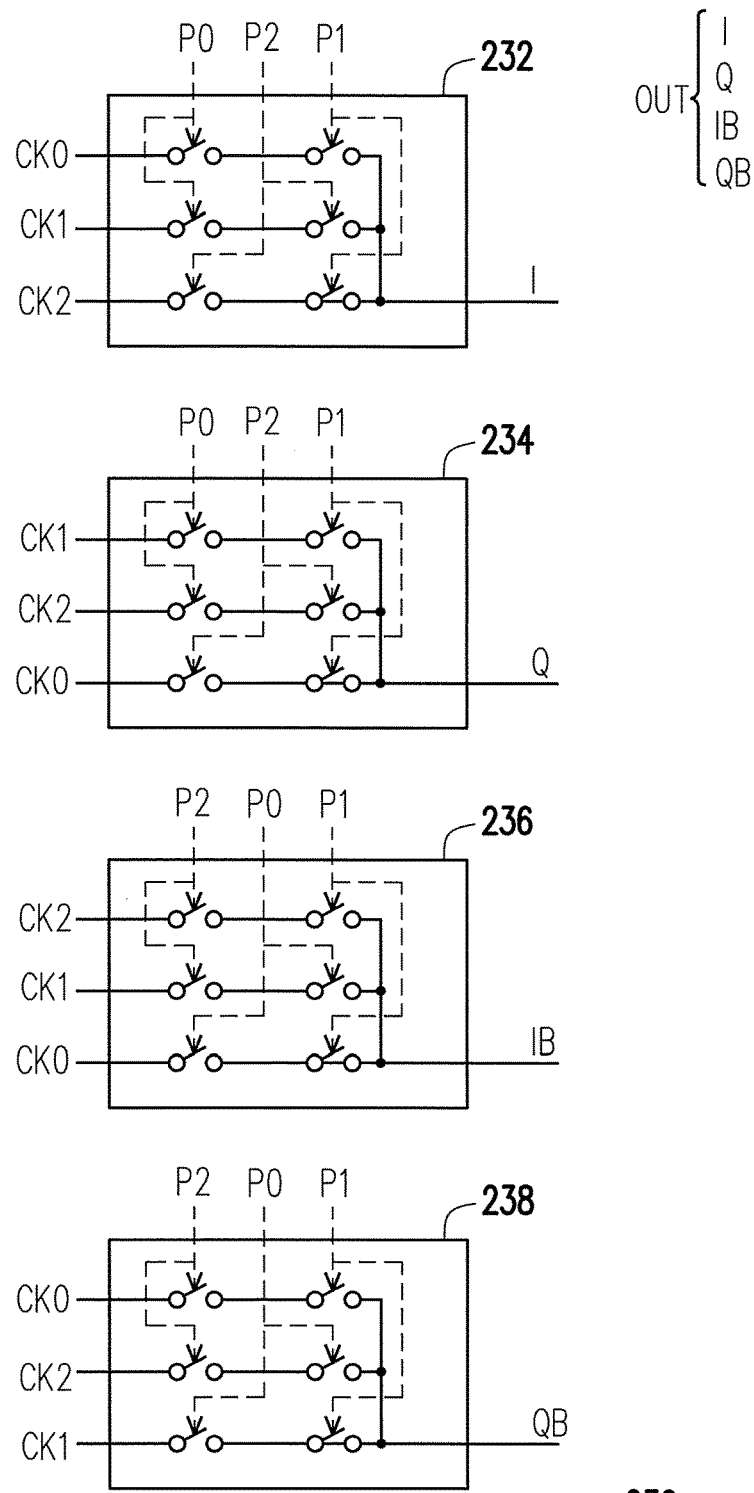
FIG. 4 is a schematic block diagram illustrating the one or more output circuits of the signal generation circuit 130 in FIG. 1 according to an exemplary embodiment of the disclosure.

FIG. 4 is a schematic block diagram illustrating the output circuits of the signal generation circuit in FIG. 1 according to an exemplary embodiment of the disclosure. In FIG. 4, the signal generation circuit 230 includes output circuits 232 to 238, wherein each of the output circuits 232 to 238 is configured to output one of the output signals OUT according to the clock signals CK0 to CK2 and the phase signals without receiving feedback of any of the one or more output signals. The output signals OUT may be one or more of the in-phase and quadrature-phase components of a signal (I, Q, IB, QB), but the disclosure is not limited thereto. Each of the output circuits 232 to 238 has a plurality of respective input terminals, a respective output terminal and a plurality of respective switches. The respective input terminals of each output circuit are configured to receive the clock signals CK0 to CK2. The respective output terminal is configured to output one of the output signals OUT. Each of the plurality of respective switches is coupled between one of the respective input terminals and the respective output terminal and is controlled by one of the phase signals P0 to P2. The respective switches in each of the output circuits 232 to 238 are selectively switched ON or OFF according to the phase signals P0 to P2 to generate one of the output signals OUT. In FIG. 4, the signal generation circuit 230 includes four output circuits 232 to 238 for generating four output signals I, Q, IB and IQ respectively. However, the number of output circuits and output signals are set according to the designed requirements.

Figure 5:
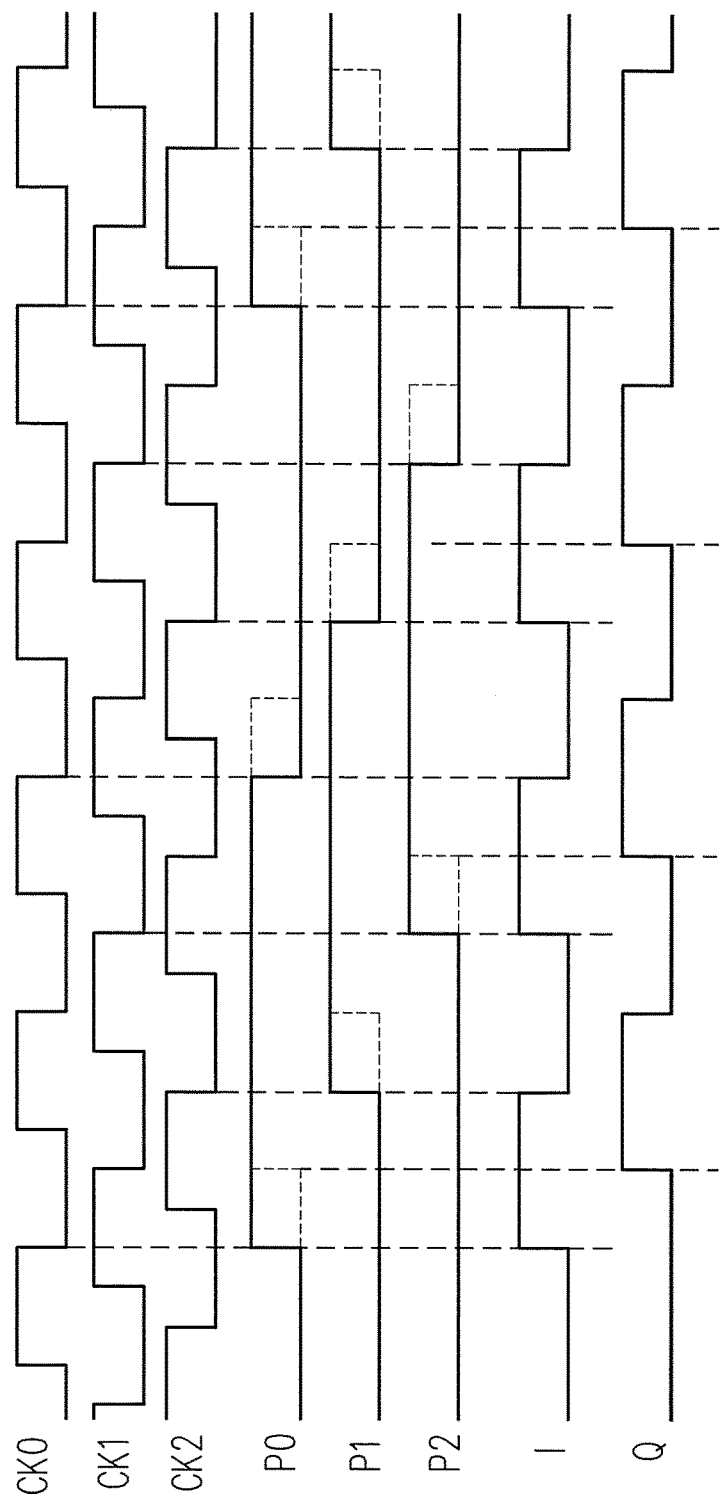
FIG. 5 illustrates the waveforms of the multi-phase clock signal, phase signals, and one of the output signals according to an exemplary embodiment of the disclosure.

FIG. 5 illustrates the waveforms of the multi-phase clock signal, phase signals, and one of the output signals according to an exemplary embodiment of the disclosure. In FIG. 5, the clock signals CK0 to CK2 of the multi-phase clock signal have the first frequency and the clock signals CK0 to CK2 have different phases. The phase signals P0 to P2 have a frequency lower than the first frequency and being phase-delay from each other. The output signal I has a second frequency that is lower than the first frequency of the clock signal CK0 to CK2.

Referring to FIG. 4 and FIG. 5, in the output circuit 232, when the first phase signal P0 is at high logic level, the switches controlled by the first phase signal P0 are turned on for allowing the clock signal at the input terminal of each switch to be outputted to the output terminal of the corresponding switch. When the second phase signal P1 is at high logic level, the switches controlled by the second phase signal P1 are turned on for allowing the clock signal at the input terminal of each switch to be outputted to the output terminal of the corresponding switch. Similarly, when the third phase signal P2 is at high logic level, the switches controlled by the third phase signal P2 is turned on for allowing the clock signal at the input terminal of each switch to be outputted to the output terminal of the corresponding switch. The output terminal I is coupled to the output terminals of the switches in the output circuit 232 to selectively receive the clock signals CK0 to CK2 according to the control of the phase signals P0 to P2. It should be noted that the frequency of the output signal I (also known as second frequency) is lower than the frequency of the clock signals CK0 to CK2 (also known as first frequency). For example, the inductor-less LO signal generation apparatus 100 may receive the first input clock signal having a frequency of 3.2 GHz and generate the output signals having a frequency of 2.4 GHz. The other output signals (e.g., Q, IB and QB) outputted by the output circuits 234 to 238 are generated in a similar manner above, so the description is omitted herein. By switching ON and OFF the switches of the output circuits according to appropriate phase signals P0 to P2, the inductor-less LO signal generation apparatus may generate the plurality of the LO in-phase and quadrature phase signals (output signals) without using inductors and feedback loop. Since the inductors and feedback loop are not required, the production cost can be reduced compared to the existing LO signal generation apparatus, and therefore, the LO signal generation apparatus in this disclosure may be used in a wide range of applications.

Figure 7:
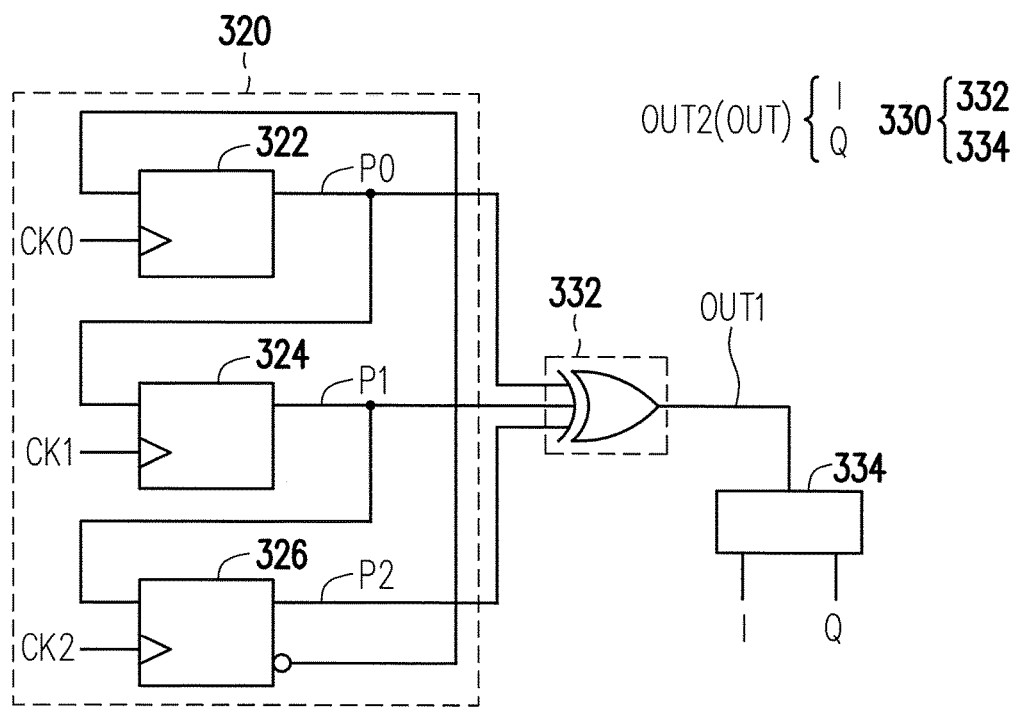
FIG. 7 is a schematic block diagram illustrating the phase signal generation circuit and the signal generation circuit in FIG. 1 according to another exemplary embodiment of the disclosure.

FIG. 7 is a schematic block diagram illustrating the phase signal generation circuit and the signal generation circuit in FIG. 1 according to another exemplary embodiment of the disclosure. In FIG. 7, the phase signal generation circuit 320 is similar to that illustrated in FIG. 3. Therefore, the description related to the phase signal generation circuit 320 is omitted herein. The signal generation circuit 330 includes a frequency pulse sharper 332 and a frequency divider 334. The frequency pulse sharper 332 acts as a frequency speed-up circuit which is used to increase the frequency of signal flowing through the frequency pulse sharper 332. The frequency pulse sharper 332 is coupled to the phase signal generation circuit 320 to receive the plurality of phase signals P0 to P2 and output a signal OUT1 having a frequency (also known as third frequency) higher than the frequency of the phase signals P0 to P2. In FIG. 3, the frequency pulse sharper 332 is a XOR gate. However, the disclosure is not limited thereto. The frequency pulse sharper 332 may be any other circuits or logic gates which have a function of increasing the frequency of the signal flowing through the frequency pulse sharper 332. In the case that the frequency pulse sharper is an XOR gate, the truth table of the XOR gate having three inputs is shown in Table (1) as follows:

TABLE I

Truth table of a XOR gate.

| Input | | | Output |
|---|---|---|---|
| P0 | P1 | P2 | OUT1 |
| 0 | 0 | 0 | 1 |
| 0 | 0 | 1 | 0 |
| 0 | 1 | 0 | 0 |
| 0 | 1 | 1 | 1 |
| 1 | 0 | 0 | 0 |
| 1 | 0 | 1 | 1 |
| 1 | 1 | 0 | 1 |
| 1 | 1 | 1 | 0 |

Table I shows the truth table of the XOR gate with three inputs P0, P1 and P2 and one output OUT1. Since the truth table of the XOR with three inputs is well known for those of skilled in the relevant art, the detailed description of the truth table is omitted herein.

The frequency divider 334 is coupled to the frequency pulse sharper 332 to receive the signal OUT1 which has the third frequency, and outputting the output signals OUT2 which has the second frequency which is lower than the third frequency. The frequency divider 334 may be any circuit which has a function of dividing the frequency of a signal.

Figure 8:
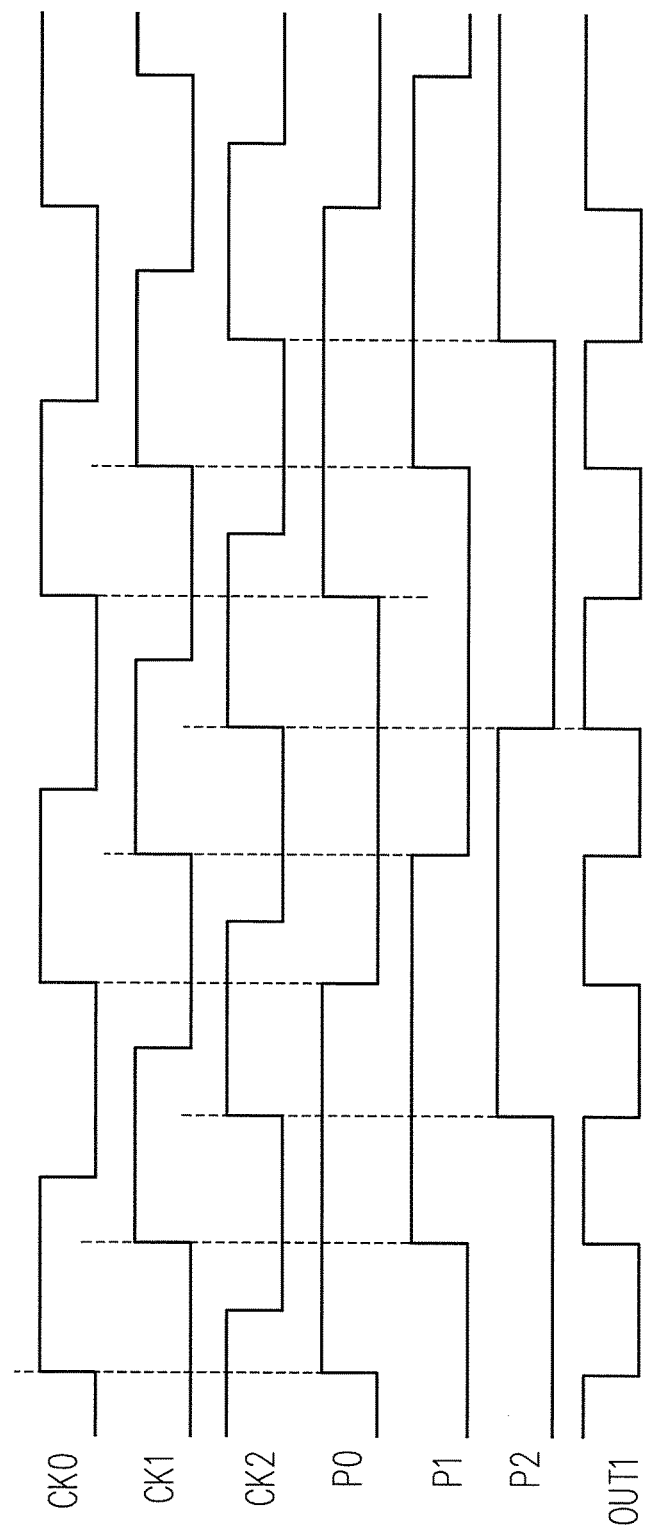
FIG. 8 illustrates the waveforms of the multi-phase clock signal, phase signals, and a signal outputted by the frequency pulse sharper according to an exemplary embodiment of the disclosure.

FIG. 8 illustrates the waveforms of the multi-phase clock signal, phase signals, and the signal OUT1 outputted by the frequency pulse sharper 332 according to an exemplary embodiment of the disclosure. Referring to FIG. 8, the clock signals CK0 to CK2 of the multi-phase clock signal outputted by the multi-phase signal generation circuit; the phase signals P0 to P2 are outputted by the phase signal generation circuit 320; and the signal OUT1 is the outputted signal of the frequency pulse sharper 332. Referring to FIG. 7, FIG. 8 and Table (1), when the frequency pulse sharper 332 is a XOR gate, if the logic level of the phase signal {P0, P1, P2} are respectively [{0, 0, 0}, {0, 1, 1}, {1, 0, 1}, {1, 1, 0}], then the signal OUT1 has a high logic level. Otherwise, the signal OUT1 has a low logic level. It should be noted that, the signal OUT1 outputted by the frequency pulse sharper 332 is higher than both of the frequency of the phase signals P0 to P2 inputted to the frequency pulse sharper 332 and the frequency of the clock signals CK0 to CK2 of the multi-phase clock signal. For example, the frequency of the clock signals CK0 to CK2 is 3.2 GHz and the frequency of the signal OUT1 is 4.8 GHz. Although the output signals (I, Q, IB, QB) which is obtained by dividing the frequency of the signal OUT1 is not shown in FIG. 8, those of skilled in the art will recognize the waveform and characteristic (e.g., frequency and/or amplitude) of the output signals (I, Q, IB and QB).

In summary, the inductor-less local oscillator (LO) signal generation apparatus configured to generate a plurality of output signals from the input clock signal is introduced in this disclosure. Neither inductors nor feedback loop can be used in the inductor-less LO signal generation apparatus in the embodiments. Consequently, the topology can be simple and robust, and the stability of the output signals may be unaffected by the mismatch between the clock signals of the multi-phase clock signal. Moreover, since the required number of delay elements for implementing the multi-phase signal generation circuit can be small (e.g., only 3 delay elements can be utilized for generating 2.4 GHz output signals from a 3.2 GHz input clock signal), the D flip-flops (DFFs) can operate at lower frequencies. This further leads to reduced power consumption and the operation of the inductor-less LO signal generation apparatus more effective than the existing LO signal generation apparatus. Furthermore, the frequency pulling effect may be prevented when LO signal generation apparatus is applied to the radio-frequency transceiver.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. An inductor-less local oscillator (LO) signal generation apparatus comprising:
    a multi-phase signal generation circuit, receiving an input clock signal having a first frequency to generate a multi-phase clock signal, wherein the multi-phase clock signal comprises a plurality of clock signals each having the first frequency and different phases;
    a phase signal generation circuit, coupled to the multi-phase signal generation circuit, receiving the multi-phase clock signal and outputting a plurality of phase signals indicating the phases of the clock signals; and
    one or more output circuits, each configured to output one of one or more output signals according to the clock signals and the phase signals without receiving feedback of any of the one or more output signals, wherein each of the one or more output circuits comprises:
        a plurality of respective input terminals configured to receive the clock signals;
        a respective output terminal configured to output one of one or more output signals; and
        a plurality of respective switches each coupled between one of the respective input terminals and the respective output terminal and controlled by one of the phase signals.

2. The inductor-less LO signal generation apparatus of claim 1, wherein each of the one or more output signals has a frequency substantially equal to a second frequency which is lower than the first frequency.

3. The inductor-less LO signal generation apparatus of claim 1, wherein the multi-phase signal generation circuit comprises a delay line configured to generate the clock signals having different phases.

4. The inductor-less LO signal generation apparatus of claim 1, wherein the multi-phase signal generation circuit comprises a plurality of delay elements connected in series, each of the delay elements has an output terminal configured to output one of the clock signals of the multi-phase clock signal.

5. The inductor-less LO signal generation apparatus of claim 4, wherein the number of the delay elements are determined according to the first frequency and the second frequency.

6. The inductor-less LO signal generation apparatus of claim 4, wherein the number of the delay elements is three.

7. The inductor-less LO signal generation apparatus of claim 4, wherein the number of the delay elements is two, and one of the clock signals of the multi-phase clock signal is the input clock signal.

8. The inductor-less LO signal generation apparatus of claim 1, wherein the phase signal generation circuit comprises:
  a plurality of latches each receiving one of the clock signals of the multi-phase clock signal and outputting one of the phase signals;
  wherein each of the phase signals has a frequency lower than the first frequency and the phase signals have different phases.

9. The inductor-less LO signal generation apparatus of claim 1, wherein each of the one or more output circuits receives the plurality of the phase signals and the plurality of the clock signals, the plurality of respective switches of each of the one or more output circuits are controlled by the phase signals to output the one or more output signals, and the one or more output signals comprise at least one of an in-phase clock signal and a quadrature phase clock signal.

10. The inductor-less LO signal generation apparatus of claim 9, wherein the plurality of respective switches of each of the one or more output circuits are selectively switched ON or OFF according to the plurality of the phase signals to generate the one or more output signals.

11. The inductor-less LO signal generation apparatus of claim 8, further comprising:
  a frequency pulse sharper, coupled to the plurality of latches, receiving the plurality of phase signals to generate a signal having a third frequency, wherein the third frequency is higher than the first frequency;
  a frequency divider, receiving the signal from the frequency pulse sharper and dividing the third frequency of the signal from the frequency pulse sharper to generate the one or more output signals having a frequency substantially equal to the second frequency, wherein the second frequency is smaller than the third frequency.

12. The inductor-less LO signal generation apparatus of claim 11, wherein the first frequency is 3.2 GHz, the second frequency is 2.4 GHz, and the third frequency is 4.8 GHz.

13. The inductor-less LO signal generation apparatus of claim 1, wherein the first frequency is 3.2 GHz, and the second frequency is 2.4 GHz.

14. The inductor-less LO signal generation apparatus of claim 1, wherein there is no inductor in the inductor-less LO signal generation apparatus.

* * * * *